(12) United States Patent
Kloss et al.

(10) Patent No.: US 8,044,605 B2
(45) Date of Patent: Oct. 25, 2011

(54) HIGH-PRESSURE DISCHARGE LAMP WITH AN IMPROVED STARTING CAPABILITY, AS WELL AS A HIGH-VOLTAGE PULSE GENERATOR

(75) Inventors: Andreas Kloss, Neubiberg (DE); Steffen Walter, Oberpframmern (DE)

(73) Assignee: OSRAM AG, Munich (DE)

( * ) Notice: Subject to any disclaimer, the term of this patent is extended or adjusted under 35 U.S.C. 154(b) by 505 days.

(21) Appl. No.: 12/227,952

(22) PCT Filed: Jun. 4, 2007

(86) PCT No.: PCT/EP2007/055470
§ 371 (c)(1), (2), (4) Date: Dec. 3, 2008

(87) PCT Pub. No.: WO2007/141242
PCT Pub. Date: Dec. 13, 2007

(65) Prior Publication Data
US 2010/0060168 A1    Mar. 11, 2010

(30) Foreign Application Priority Data
Jun. 8, 2006 (DE) .......................... 10 2006 026 751

(51) Int. Cl.
*H05B 39/00* (2006.01)
*H05B 41/16* (2006.01)
(52) U.S. Cl. ........................................ 315/289; 315/246

(58) Field of Classification Search ................ 315/84.51, 315/246, 234, 261, 330, 335, DIG. 2, 289
See application file for complete search history.

(56) References Cited

U.S. PATENT DOCUMENTS

| | | | |
|---|---|---|---|
| 3,289,015 A | | 11/1966 | Fitch et al. |
| 4,217,468 A | | 8/1980 | Rice et al. |
| 4,325,004 A | | 4/1982 | Proud et al. |
| 4,353,012 A | | 10/1982 | Fallier, Jr. et al. |
| 4,629,945 A | * | 12/1986 | Fallier et al. .................. 315/207 |
| 4,721,888 A | * | 1/1988 | Proud et al. ...................... 315/60 |
| 4,724,362 A | * | 2/1988 | Lester .......................... 315/289 |
| 5,567,995 A | | 10/1996 | O'Loughlin et al. |
| 6,853,151 B2 | | 2/2005 | Leong et al. |
| 2003/0001519 A1 | | 1/2003 | Kirkpatrick et al. |

FOREIGN PATENT DOCUMENTS
| | | |
|---|---|---|
| EP | 0 049 465 A2 | 4/1982 |
| EP | 0 436 200 A | 7/1991 |
| WO | WO 03/059025 A3 | 7/2003 |

OTHER PUBLICATIONS
Betriebsgerate und Schaltungen fur elektrische Lampen, 1992, pp. 217, 235, 296, and 297.

* cited by examiner

*Primary Examiner* — Douglas W Owens
*Assistant Examiner* — Minh D A
(74) *Attorney, Agent, or Firm* — Holtz, Holtz, Goodman & Chick, PC

(57) ABSTRACT

A spiral pulse generator is used to start the high-pressure discharge lamp, and is accommodated directly in the outer bulb of the lamp. The spiral pulse generator uses a material with a matched $\in$ and $\mu$.

15 Claims, 5 Drawing Sheets

HIGH-PRESSURE DISCHARGE LAMP WITH AN IMPROVED STARTING CAPABILITY, AS WELL AS A HIGH-VOLTAGE PULSE GENERATOR

This application is a U.S. National Phase Application under 35 USC 371 of International Application PCT/EP2007/055470, filed Jun. 4, 2007, which is incorporated herein in its entirety by this reference.

TECHNICAL FIELD

The invention is based on a high-pressure discharge lamp in accordance with the preamble of claim 1. Such lamps are in particular high-pressure discharge lamps for general lighting or for photo-optical purposes. The invention furthermore relates to a high-voltage pulse generator which can be used in particular for a lamp.

PRIOR ART

The problem of starting high-pressure discharge lamps is at present solved by virtue of the fact that the starting device is integrated in the ballast. One disadvantage with this is the fact that the feed lines need to be designed to be resistant to high voltages.

In the past, repeated attempts have been made to integrate the starting unit in the lamp. These attempts involved integrating it in the base. Particularly effective starting which promises high pulses is achieved by means of so-called spiral pulse generators; see U.S. Pat. No. 3,289,015. Quite some time ago such devices were proposed for different high-pressure discharge lamps, such as metal-halide lamps or sodium high-pressure lamps; see U.S. Pat. Nos. 4,325,004, 4,353,012, for example. However, they could not establish themselves because, for one reason, they are too expensive. Secondly, the advantage of integrating them in the base is insufficient since the problem of supplying the high voltage into the bulb remains. The probability of damage to the lamp, whether it be insulation problems or a rupture in the base, therefore increases considerably. Starting devices which have been conventional to date generally could not be heated to above 100° C. The voltage generated then needed to be supplied to the lamp, which necessitates lines and lampholders with a corresponding resistance to high voltages, typically approximately 5 kV.

In conventional starting circuits, a capacitor is normally discharged into the primary winding of a starting transformer via a switch, e.g. a spark gap. The desired high-voltage pulse is then induced into the secondary winding. To this end, see Sturm/Klein "Betriebsgeräte and Schaltungen für elektrische Lampen" (Operational equipment and circuits for electric lamps), pp. 193 to 195 (6th edition, 1992).

DESCRIPTION OF THE INVENTION

The object of the present invention is to provide a high-pressure discharge lamp whose starting response is markedly improved in comparison with previous lamps and with which there is no danger of any damage as a result of the high voltage. This applies in particular to metal-halide lamps, with it being possible for the material of the discharge vessel to be either quartz glass or ceramic.

This object is achieved by the characterizing features of claim 1.

Particularly advantageous refinements can be found in the dependent claims.

Furthermore, an object of the present invention is to specify a compact high-voltage pulse generator.

This object is achieved by the characterizing features of claim 14.

According to the invention, a high-voltage pulse with at least 1.5 kV, which is required for starting the lamp, is now generated by means of a special heat-resistant spiral pulse generator, which is integrated in the immediate vicinity of the discharge vessel in the outer bulb. Not only cold-starting, but also hot-restarting is therefore possible.

The spiral pulse generator now used is in particular a so-called LTCC component. This material is a special ceramic, which can be made heat-resistant up to 600° C. Although LTCC has already been used in connection with lamps, see US 2003/0001519 and U.S. Pat. No. 6,853,151, it has been used for entirely different purposes in lamps which are, to all intents and purposes, hardly subjected to temperature loading at all, with typical temperatures of below 100° C. The particular value of the high temperature stability of LTCC is to be found in connection with starting high-pressure discharge lamps, such as, in particular, metal-halide lamps with starting problems.

The spiral pulse generator is a component which combines the properties of a capacitor with those of a waveguide for generating starting pulses with a voltage of at least 1.5 kV. For production purposes, two ceramic "green films" have a metallic conductive paste printed on them, are subsequently wound in offset fashion to form a spiral and finally pressed isostatically to form a molding. The subsequent co-sintering of metal paste and ceramic film takes place in air in the temperature range of between 800 and 900° C. This processing allows the operating range of the spiral pulse generator to include temperature loading of up to 700° C. As a result, the spiral pulse generator can be accommodated in the direct vicinity of the discharge vessel in the outer bulb, but also in the base or in the immediate vicinity of the lamp.

Independently of this, such a spiral pulse generator can also be used for other applications because it is not only stable at high temperatures but is also extremely compact. It is essential for this purpose that the spiral pulse generator is designed as an LTCC component, comprising ceramic films and a metallic wetting agent on the film, in particular in the form of a metallic conductive paste. In order to provide a sufficient output voltage, the spiral should comprise at least 5 turns.

In addition, on the basis of this high-voltage pulse generator, a starting unit can be specified which additionally comprises at least one charging resistor and a switch. The switch may be a spark gap or else a DIAC using SiC technology.

It is preferable in the case of an application for lamps for it to be accommodated in the outer bulb. This is because this dispenses with the need for a voltage feed line which is resistant to high voltages.

In addition, a spiral pulse generator can be dimensioned such that the high-voltage pulse even enables hot-restarting of the lamp. The dielectric made from ceramic is characterized by an extremely high relative permittivity $\in$ of $\in$>10, with it being possible for an $\in$ of typically 70, up to $\in$=100 to be achieved, depending on the material and construction. This allows for a very high capacitance of the spiral pulse generator and allows for a comparatively large temporal width of the pulses generated. This results in a very compact design of the spiral pulse generator being possible, so that it can be integrated in conventional outer bulbs of high-pressure discharge lamps.

The high pulse width also facilitates the flashover in the discharge volume.

Any conventional glass can be used as the material of the outer bulb, that is to say in particular hard glass, vycor or quartz glass. The choice of filling is also not subject to any particular restriction.

The desired properties of an LTCC spiral pulse generator are adapted in a particularly simple fashion by not just using a material with the desired relative permittivity as the dielectric, but by using a mixture of two materials, of which a first material has a given $\in_r$, and the second material has a given $\mu_r$, that is to say a given relative permeability. Whereas a single material with an $\in$ between 4 and 1000 was used up until now, it is now possible to use a mixture, in which the first material can have an $\in$ between 2 and 1000, while the second material is ferritic and can have a $\mu$ between 1 and 5000. Preferably, $\mu_r$ is as high as possible, and has a value of at least 10, particularly preferably of at least 100. Previously, the value of $\mu$ in known materials was close to 1; adapting this was not possible. A typical mixture has a proportion of 5 to 35% by weight of the ferritic material.

The particular value of this novel degree of freedom becomes apparent from the following consideration:

In order to adapt the pulse width, the impedance, and pulse energy of a spiral pulse generator, $\mu$ and $\in$ should be selected according to the following guidelines: The impedance $Z_0$ of a spiral generator is given by $$Z_0 \sim \sqrt{\frac{\mu_0 \cdot \mu_r}{\varepsilon_0 \cdot \varepsilon_r}},$$

where $\mu_0$ is the magnetic constant, $\in_0$ is the electric constant, $\mu_r$ is the relative permeability and $\in_r$ is the relative permittivity. The energy of the generated pulse is proportional to $\sqrt{\in_r}$. The pulse width of the generator $\tau$ is given by $\tau \sim \sqrt{\mu_0 \cdot \mu_r \cdot \in_0 \cdot \in_r}$. So that the generator operates efficiently, $L_S \ll (Z_0 \cdot \tau)$ must hold, where $L_s$ is the inductance of the short-circuit switch. Since $Z_0 \cdot \tau \sim \mu_r$, this adaptation to the inductance of the short-circuit switch can be achieved by selection of the relative permeability.

BRIEF DESCRIPTION OF THE DRAWINGS

The invention will be explained in more detail below with reference to a plurality of exemplary embodiments. In the figures.

PREFERRED EMBODIMENT OF THE INVENTION

Figure 1:
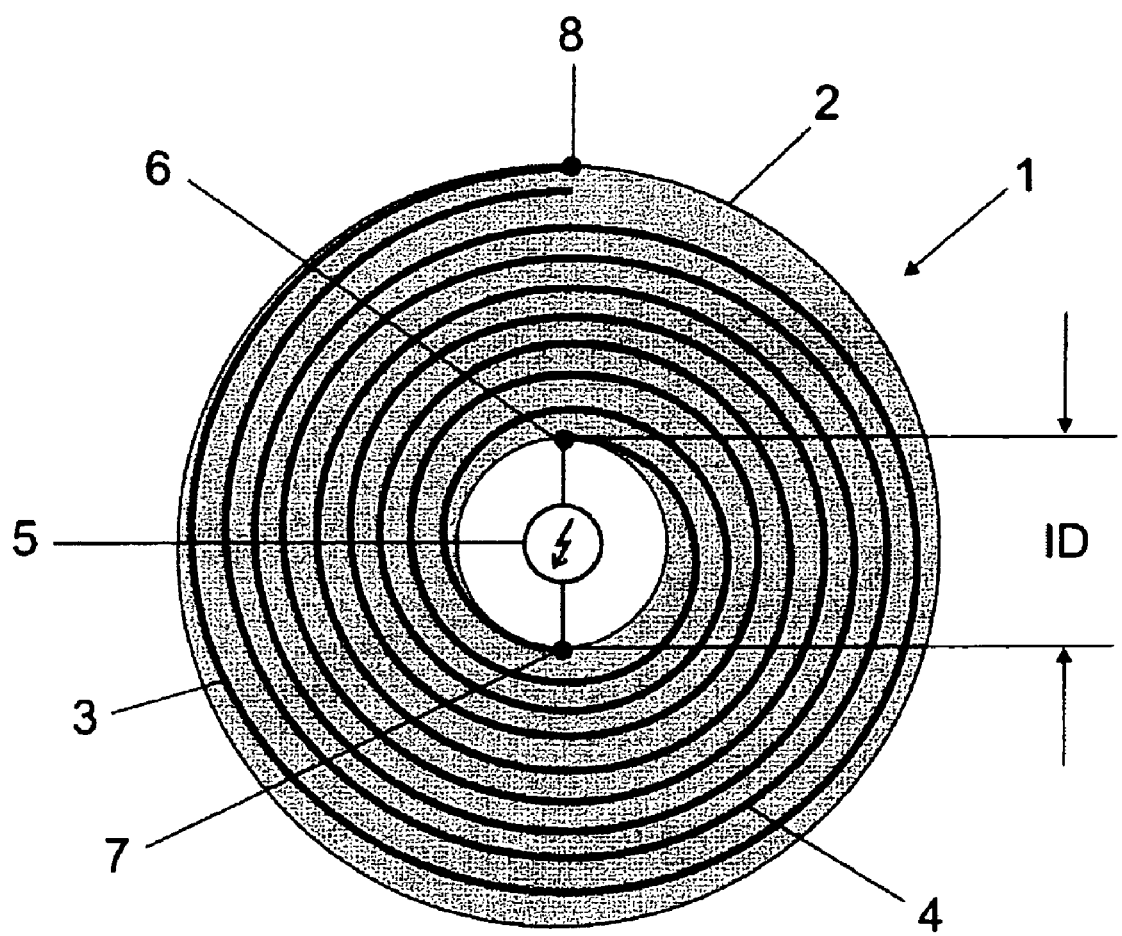
FIG. 1 shows the basic design of a spiral pulse generator.

FIG. 1 shows the design of a spiral pulse generator 1 in a plan view. It comprises a ceramic cylinder 2, into which two different metallic conductors 3 and 4 are wound in spiral fashion in the form of a foil strip. The cylinder 2 has a hollow interior and has a given inner diameter ID. The two inner contacts 6 and 7 of the two conductors 3 and 4 are approximately opposite one another and are connected to one another via a spark gap 5.

Only the outer one of the two conductors has a further contact 8 on the outer edge of the cylinder. The other conductor ends open. The two conductors thereby together form a waveguide in a dielectric medium (the ceramic).

The spiral pulse generator is either wound from two ceramic films coated with metal paste or constructed from two metal foils and two ceramic films. An important characteristic in this case is the number n of turns, which should preferably be of the order of 5 to 100. This winding arrangement is then laminated and subsequently sintered, which results in an LTCC component. The spiral pulse generators created in such a way with a capacitor property are then connected to a spark gap and a charging resistor. The ceramic film is here a mixture of dielectric material with $\in$ between 2 and 1000 and ferritic material with $\mu$ between 1.5 and 5000

The spark gap can be located at the inner or the outer terminals or else within the winding of the generator. A spark gap which is based on SiC and is very thermally stable can preferably be used as the high-voltage switch which initiates the pulse. For example, the switching element MESFET by Cree can be used. This is suitable for temperatures of above 350° C.

In a specific exemplary embodiment, a ceramic material with $\in=60$ to 70 is used. The dielectric used here is preferably a ceramic film, in particular a ceramic strip such as Heratape CT 707 or preferably CT 765, each by Heraeus or else a mixture of the two. It has a thickness of the green film of typically between 50 and 150 µm. The conductor used is in particular Ag conductive paste such as "Cofirable Silver", likewise by Heraeus. A specific example is CT 700 by Heraeus. Good results are also achieved with the metal paste 6142 by DuPont. These parts can be laminated effectively and then burnt out ("burnout") and sintered together ("co-firing").

The inner diameter ID of the spiral pulse generator is 10 mm. The width of the individual strips is likewise 10 mm. The film thickness is 50 µm and also the thickness of the two conductors is in each case 50 µm. The charging voltage is 300 V. Under these conditions, the spiral pulse generator achieves an optimum for its properties with a number of turns of n=20 to 70.

Figure 2:
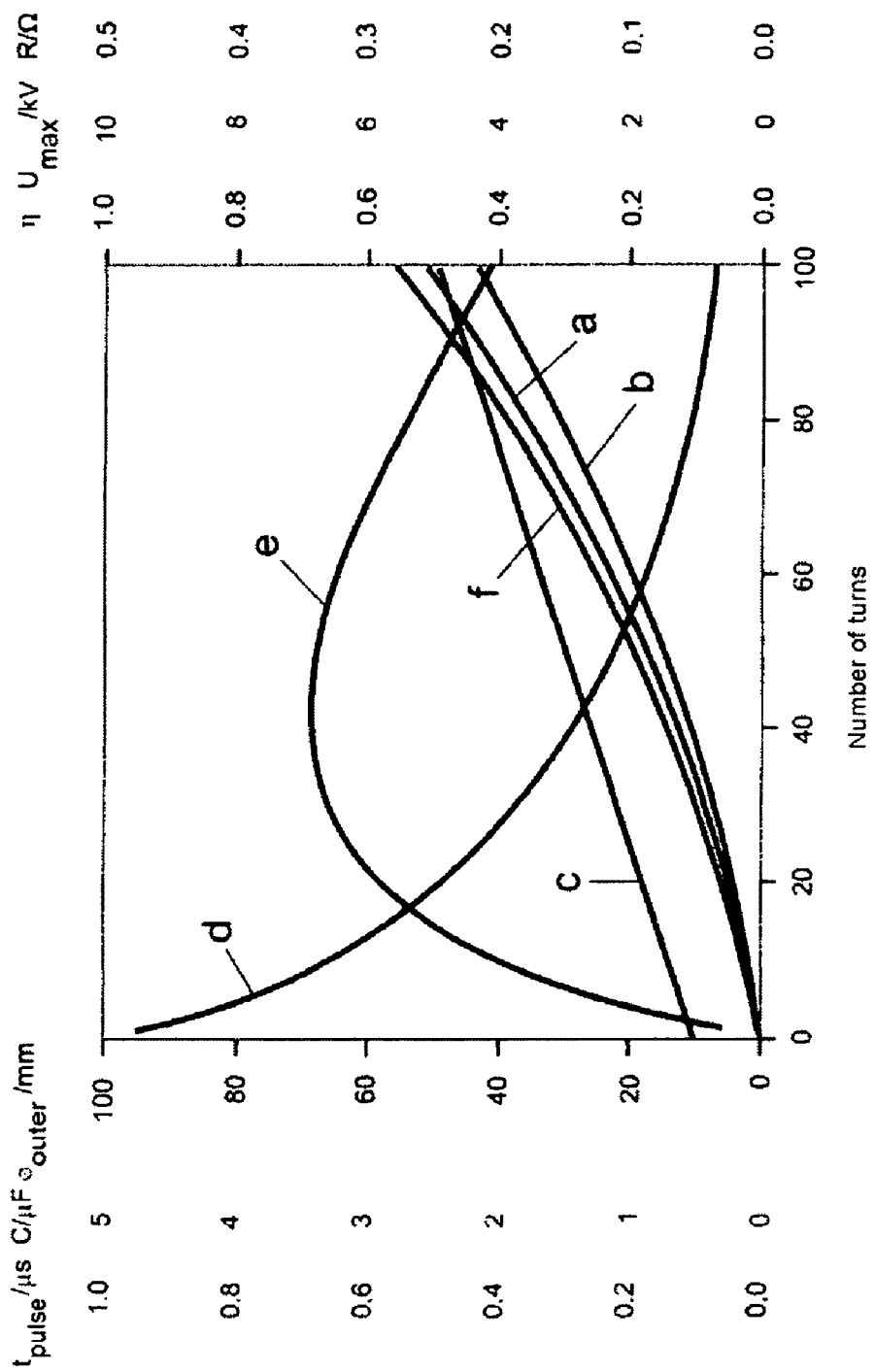
FIG. 2 shows characteristics of an LTCC spiral pulse generator.

FIG. 2 illustrates the associated full width at half maximum of the high-voltage pulse in µs (curve a), the total capacitance of the component in µF (curve b), the resultant outer diameter in mm (curve c), and the efficiency (curve d), the maximum pulse voltage (curve e) in kV and the conductor resistance in Ω (curve f).

Figure 3:
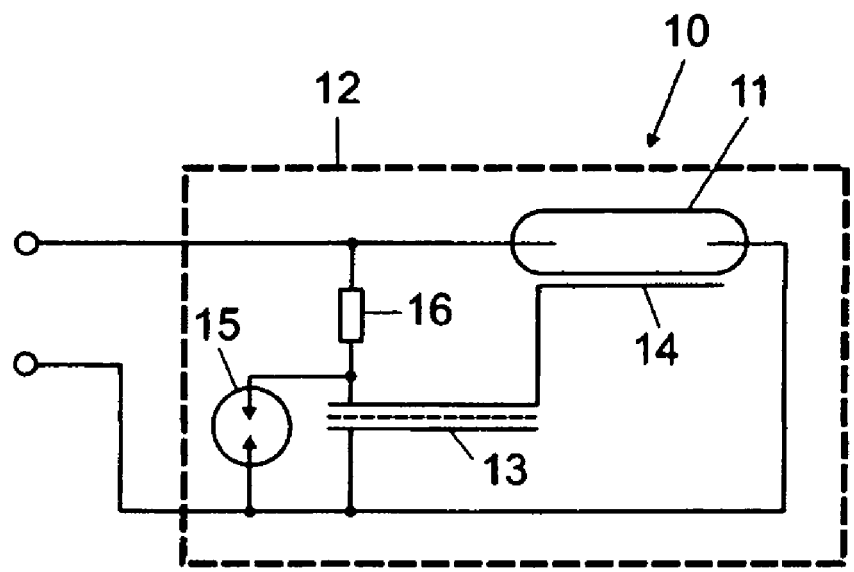
FIG. 3 shows the basic design of a sodium high-pressure lamp with a spiral pulse generator in the outer bulb.

FIG. 3 shows the basic design of a sodium high-pressure lamp 10 with a ceramic discharge vessel 11 and an outer bulb 12 with a spiral pulse generator 13 integrated therein, a starting electrode 14 being fitted on the outside on the ceramic discharge vessel 11. The spiral pulse generator 13 is accommodated with the spark gap 15 and the charging resistor 16 in the outer bulb.

Figure 4:
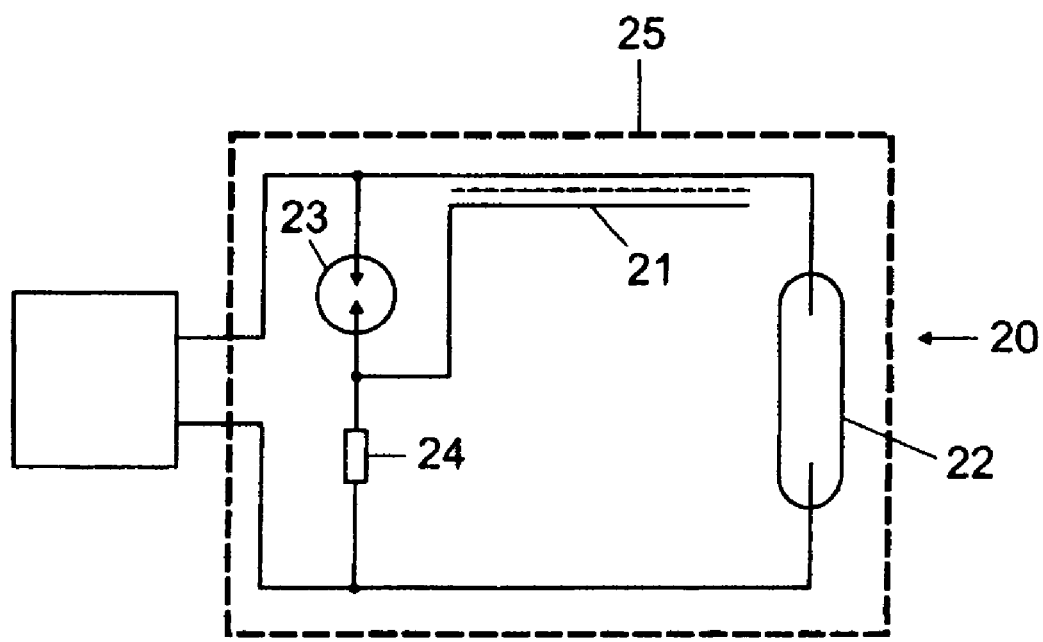
FIG. 4 shows the basic design of a metal-halide lamp with a spiral pulse generator in the outer bulb.

FIG. 4 shows the basic design of a metal-halide lamp 20 with an integrated spiral pulse generator 21, with no starting electrode being fitted on the outside on the discharge vessel 22, which can be manufactured from quartz glass or ceramic. The spiral pulse generator 21 is accommodated with the spark gap 23 and the charging resistor 24 in the outer bulb 25.

Figure 5:
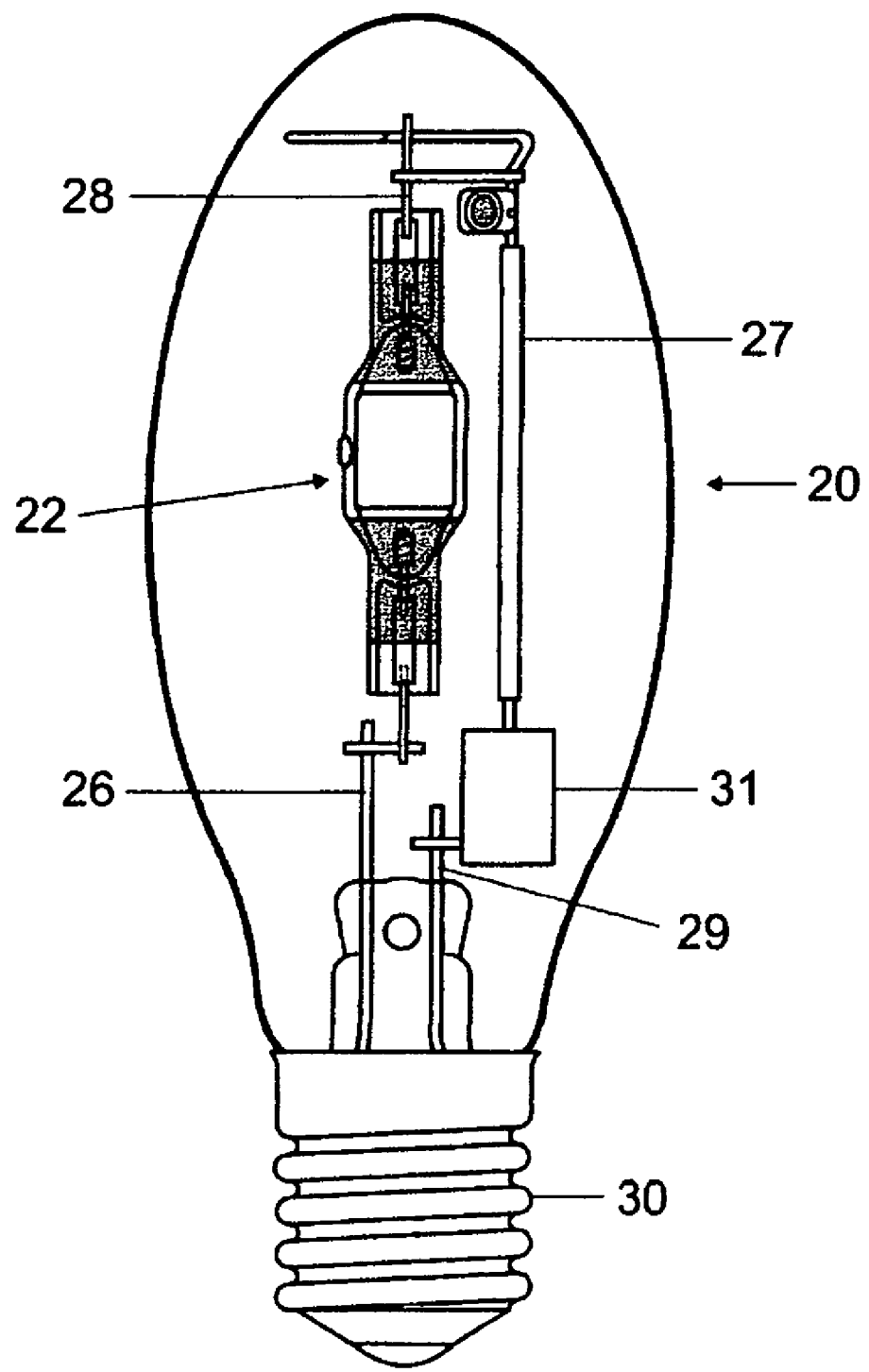
FIG. 5 shows a metal-halide lamp with a spiral pulse generator in the outer bulb.

FIG. 5 shows a metal-halide lamp 20 with a discharge vessel 22, which is held by two feed lines 26, 27 in an outer bulb. The first feed line 26 is a wire with a short section bent back. The second feed line 27 is substantially a bar, which leads to the feedthrough 28 remote from the base. A starting unit 31, which contains the spiral pulse generator, the spark gap and the charging resistor, is arranged between the feed line 29 out of the base 30 and the bar 27, as indicated in FIG. 4.

Figure 6:
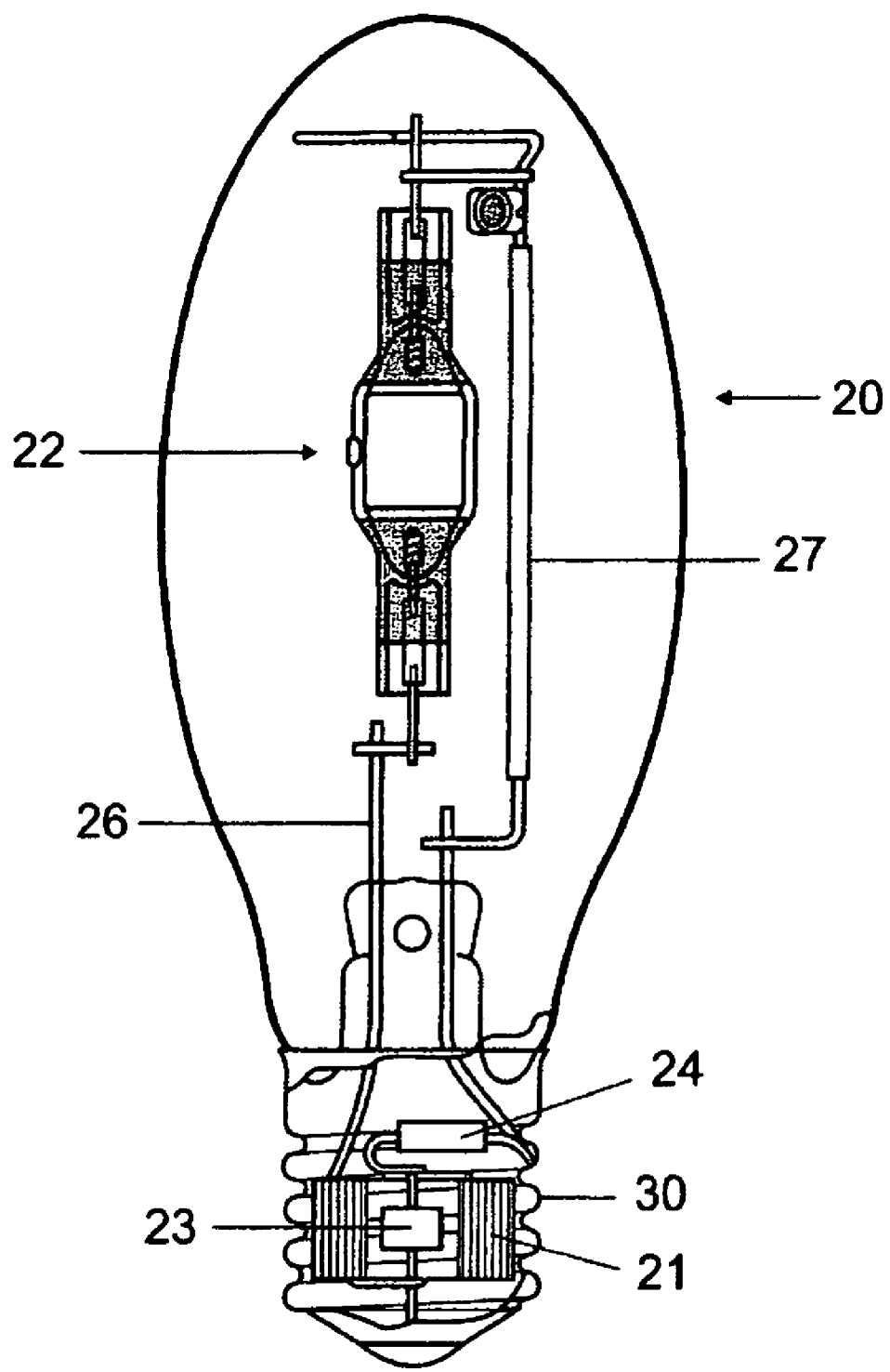
FIG. 6 shows a metal-halide lamp with a spiral pulse generator in the base.

FIG. 6 shows a metal-halide lamp 20 similar to that in FIG. 5 with a discharge vessel 22, which is held by two feed lines 26, 27 in an outer bulb 25. The first feed line 26 is a wire with a short section bent back. The second feed line 27 is substantially a bar, which leads to the feedthrough 28 remote from the base. In this case, the starting unit is arranged in the base 30, to be precise both the spiral pulse generator 21 and the spark gap 23 and the charging resistor 24.

This technology can also be used for lamps without electrodes, it being possible for the spiral pulse generator to act as a starting aid.

Further applications of this compact high-voltage pulse generator involve starting other devices. The application is primarily advantageous in so-called magic spheres, in the generation of x-ray pulses and the generation of electron beam pulses. A use in motor vehicles as a replacement for the conventional ignition coils is also possible.

In this case, the number of turns n used can reach 500, so that the output voltage of up to the order of 100 kV is achieved. This is because the output voltage $U_A$, as a function of the charging voltage $U_L$, is given by $U_A = 2 \times n \times U_L \times \eta$, with the efficiency $\eta$ being given by $\eta = (AD-ID)/AD$.

The invention develops particular advantages when interacting with high-pressure discharge lamps for automobile headlamps which are filled with xenon under a high pressure of preferably at least 3 bar and metal halides. These are particularly difficult to start since the starting voltage is above 10 kV as a result of the high xenon pressure. At present, attempts are being made to accommodate the components of the starting unit in the base. A spiral pulse generator with an integrated charging resistor can be accommodated either in the base of the motor vehicle lamp or in an outer bulb of the lamp.

The invention develops very particular advantages when interacting with high-pressure discharge lamps which do not contain any mercury. Such lamps are particularly desirable for environmental protection reasons. They contain a suitable metal halide filling and in particular a noble gas such as xenon under high pressure. Due to the lack of mercury, the starting voltage is particularly high. It is above 20 kV. At present, attempts are being made to accommodate the components of the starting unit in the base. A spiral pulse generator with an integrated charging resistor can be accommodated either in the base of the mercury-free lamp or in an outer bulb of the lamp.

Known ferrites, such as iron oxides, are suited to being the second material. By way of example, if need be, Mg or Al can be used as dopant. Oxides of nickel, manganese, magnesium, zinc and cobalt are other suitable metal oxides, either on their own or in mixtures, in particular Ni—Zn. The proportion of the second material can in particular be at least 15% by weight. Its relative permeability should be at least 1.5.

The invention claimed is:

1. A high-pressure discharge lamp comprising a discharge vessel accommodated in an outer bulb, wherein a starting device generates a high-voltage pulses in the lamp, characterized in that the starting device is accommodated in the outer bulb, wherein the starting device is a spiral pulse generator which is made from a heat-resistant material, wherein the heat resistant material is low temperature co-fired ceramic (LTCC), wherein this material comprises films of ceramic material and a metallic wetting agent, and wherein the ceramic material is a mixture of a first material and a second material, wherein the first material has a relative permittivity $\in_r$ of 2 to 1000 and the second material has a relative permeability $\mu_r$ of 1 to 5000.

2. The high-pressure discharge lamp as claimed in claim 1, characterized in that the starting device is held by a frame.

3. The high-pressure discharge lamp as claimed in claim 2, wherein the frame also holds the outer bulb.

4. The high-pressure discharge lamp as claimed in claim 1, characterized in that the relative permeability of the second material is at least $\mu_r = 1.5$.

5. The high-pressure discharge lamp as claimed in claim 4, characterized in that the second material is a metal oxide.

6. The high-pressure discharge lamp as claimed in claim 5, wherein the second material is a metal oxide with a proportion of at least 15% by weight of the ceramic mixture.

7. The high-pressure discharge lamp as claimed in claim 1, characterized in that the high voltage pulses imparted by the spiral pulse generator acts directly on two electrodes in the discharge vessel.

8. The high-pressure discharge lamp as claimed in claim 1, characterized in that the high voltage pulses imparted by the spiral pulse generator act on an auxiliary starting electrode fitted to the outside of the discharge vessel.

9. The high-pressure discharge lamp as claimed in claim 1, characterized in that the spiral pulse generator is constructed from a plurality of layers, wherein the number n of layers is at least n=5.

10. The high-pressure discharge lamp as claimed in claim 9, characterized in that the number n of layers is at most n=500.

11. High-pressure discharge lamp as claimed in claim 10, wherein the number n of layers is at most n=100.

12. The high-pressure discharge lamp as claimed in claim 1, characterized in that the spiral pulse generator has an approximately hollow-cylindrical form.

13. High-pressure discharge lamp as claimed in claim 12, wherein the approximately hollow-cylindrical form has an inner diameter of at least 10 mm.

14. The high-pressure discharge lamp as claimed in claim 1, characterized in that the relative permittivity $\in_r$ of the spiral pulse generator is at least $\in_r = 10$.

15. The high-pressure discharge lamp as claimed in claim 1, characterized in that a series resistor, which limits the charging current of the spiral pulse generator, is also accommodated in the outer bulb.

* * * * *